United States Patent [19]
Yamaguchi

[11] Patent Number: 6,133,611
[45] Date of Patent: Oct. 17, 2000

[54] MOS SEMICONDUCTOR DEVICE

[75] Inventor: Akira Yamaguchi, Yokohama, Japan

[73] Assignee: Kabushiki Kaisha Toshiba, Kawasaki, Japan

[21] Appl. No.: 09/352,780

[22] Filed: Jul. 14, 1999

[30] Foreign Application Priority Data

Jul. 15, 1998 [JP] Japan ................... 10-200584

[51] Int. Cl.$^7$ .............. H01L 29/76; H01L 29/96
[52] U.S. Cl. .............. 257/374; 257/384; 257/491; 257/501; 257/510
[58] Field of Search ................... 257/328, 384, 257/395, 396, 397, 374, 501, 491, 487, 500, 546, 510

[56] References Cited

U.S. PATENT DOCUMENTS

| | | | |
|---|---|---|---|
| 5,099,302 | 3/1992 | Pavlin | 357/42 |
| 5,239,197 | 8/1993 | Yamamoto | 257/500 |
| 5,317,180 | 5/1994 | Hutter et al. | 257/337 |
| 5,856,695 | 1/1999 | Ito et al. | 257/370 |
| 5,880,502 | 3/1999 | Lee et al. | 257/372 |
| 5,990,535 | 11/1999 | Palara | 257/500 |

FOREIGN PATENT DOCUMENTS 5-267660  10/1993  Japan ................... 257/500

*Primary Examiner*—Donald L. Monin, Jr.
*Attorney, Agent, or Firm*—Oblon, Spivak, McClelland, Maier & Neustadt, P.C.

[57] ABSTRACT

In a CMOS circuit including a source diffusion layer and a well region which are at the same potential, a P$^+$-type source diffusion layer and an N$^+$-type substrate diffusion layer are formed in a portion corresponding to a source region in a surface area of an N-type well region. A source contact is formed on the source and substrate diffusion layers through a salicide layer to connect the diffusion layers to their upper wiring layer. Since, therefore, the source contact can be arranged closer to a P-type well region, the layout area can be reduced.

9 Claims, 7 Drawing Sheets

MOS SEMICONDUCTOR DEVICE

BACKGROUND OF THE INVENTION

The present invention relates to a MOS (metal oxide semiconductor) semiconductor device and, more specifically, to a MOS integrated circuit in which a source diffusion layer and a semiconductor substrate (or a well region) are at the same potential.

In a conventional MOS integrated circuit, a source contact has to be formed on a source diffusion layer. Therefore, a MOS integrated circuit is generally designed under design rules having an inclusion relation between the source diffusion layer and source contact.

FIGS. 1A to 1C schematically show the arrangement of a CMOS (complementary MOS) circuit which is designed under conventional design rules. Of these figures, FIG. 1A is a plan view of the CMOS circuit, FIG. 1B is a cross-sectional view of the CMOS circuit taken along line 1B—1B of FIG. 1A, and FIG. 1C is a cross-sectional view of the CMOS circuit taken along line 1C—1C of FIG. 1A.

As shown, an N-type well region 102 and a P-type well region 103 are formed selectively on a P-type Si (silicon) substrate 101. An element isolation region 104 having an STI (shallow trench isolation) structure is formed selectively in a surface area of the Si substrate 101, as are an active region 105 of a P-channel MOS transistor and an active region 106 of an N-channel MOS transistor.

The top surfaces of the active regions 105 and 106 are covered with their respective gate insulation films 107. A gate polysilicon electrode 108 is provided so as to connect the active regions 105 and 106 with each other through the gate insulation films 107. The electrode 108 has side walls 109, 109 on both sides thereof.

In the active region 105 of the P-channel MOS transistor, P⁻-type regions 105a and 105a each having an LDD (lightly doped drain) structure are formed in a surface area of the N-type well region 102 using the gate polysilicon electrode 108 as a mask, and P⁺-type diffusion layers 105b and 105b serving as source and drain regions are formed therein using the electrode 108 and side walls 109 as masks.

A source contact 110 is formed on one (source) of the P⁺-type diffusion layers 105b and 105b through the corresponding gate insulation film 107. A drain contact 111 is formed on the other (drain) of the layers 105b through the corresponding gate insulation film 107.

In the active region 106 of the N-channel MOS transistor, N⁻-type regions 106a having the LDD structure are formed in a surface area of the P-type well region 103 using the gate polysilicon electrode 108 as a mask, and N⁺-type diffusion layers 106b and 106b serving as source and drain regions are formed therein using the electrode 108 and side walls 109 as masks.

A source contact 112 is formed on one (source) of the N⁺-type diffusion layers 106b and 106b through the corresponding gate insulation film 107. A drain contact 113 is formed on the other (drain) of the layers 106b and 106b through the corresponding gate insulation film 107.

In the CMOS circuit having the above arrangement, a negative or positive voltage is applied to the gate polysilicon electrode 108 to bring the P⁺-type diffusion layers 105b and 105b and the N⁺-type diffusion layers 106b and 106b into conduction or out of conduction. Thus, the P-channel or N-channel MOS transistor performs its switching operation.

In the above CMOS circuit, however, the P⁺-type diffusion layers 105b and 105b have to be formed far away from an interface A between the N- and P-type well regions 102 and 103 in order to prevent a short circuit from being caused between the P-type well region 103 and P⁺-type diffusion layers 105b and 105b. Usually, a distance B between each of the P⁺-type diffusion layers 105b and 105b and the interface A is set to greater than a predetermined value (a required distance under design rules between the P-type well region and P⁺-type diffusion layers) in consideration of punch through between the P-type well region 102 and P⁺-type diffusion layers 105b and 105b and variations in work precision of the N- and P-type well regions 102 and 103 and P⁺-type diffusion layers 105b and 105b.

Since, as described above, the source contact needs to be formed on the source diffusion layer (due to an inclusion relation therebetween), each of the P⁺-type diffusion layers 105b and 105b should be formed larger than the source contact 110 in the P-channel MOS transistor.

For the above reason, as illustrated in FIG. 2, a range (a hatched area) C delimited by distances B and B' with regard to the interface A between the regions 102 and 103 is a prohibited area (a so-called dead space) where the P⁺-type diffusion layers 105b and 105b cannot be formed, thereby causing a problem in which the dead space C increases the layout area and the chip size.

This problem is true of MOS integrated circuits other than the foregoing CMOS circuit, such as a MOS integrated circuit in which a substrate contact is formed separately from the source contact.

FIG. 3 is a schematic plan view illustrating a MOS integrated circuit as a flip-flop memory cell (or basic memory cell) designed under conventional design rules.

Referring to FIG. 3, in the conventional memory cell, a P-type well region (semiconductor substrate) 42 is formed so as to surround an N-type well region (semiconductor substrate) 41, and an element isolation region 43 is formed selectively in the surface areas of the N-type well region 41 and P-type well region 42, and a substantially T-shaped active region 44 of the P-channel MOS transistor and an active region 45 of the N-channel MOS transistor are arranged opposite to each other.

The top surfaces of the active regions 44 and 45 are covered with their respective gate insulation films 46. Two gate polysilicon electrodes 47a and 47b are arranged in parallel to each other to connect the active regions 44 and 45 with each other through the gate insulation films 46. The electrode 108 has side walls 109 on both sides thereof.

In the active region 44 of the P-channel MOS transistor, P⁺-type drain diffusion layers 48 and 48 whose potential differs from that of the N-type well region 41 are formed in those portions of the surface of the N-type well region 41 which correspond to drain regions outside the gate polysilicon electrodes 47a and 47b. There is a fixed distance $B_1$ between each of the layers 48 and 48 and an interface A between the N- and P-type well regions 41 and 42.

A P⁺-type source diffusion layer 49 having the same potential as that of the N-type well region 41 is formed in that portion of the surface of the N-type well region 41 which corresponds to a common source region between the gate polysilicon electrodes 47a and 47b. The layer 49 is drawn toward the interface A between the regions 41 and 42 and located at a fixed distance $B_2$ (which is shorter than $B_1$) from the interface A.

An N⁺-type substrate diffusion layer 50 is formed selectively in part of the N-type well region 41 as one different from the source diffusion layer 49.

Drain contacts 51 and 51 are connected to their respective drain diffusion layers 48 and 48 through the gate insulation film 46. A source contact 52 is connected to the source diffusion layer 49 through the gate insulation film 46, and a substrate contact 54 is connected to the substrate diffusion layer 50 through an insulation film 53.

In the active region 45 of the N-channel MOS transistor, $N^+$-type drain diffusion layers 55 and 55 whose potential differs from that of the P-type well region 42 are formed in those portions of the surface of the P-type well region 42 which correspond to drain regions outside the gate polysilicon electrodes 47a and 47b.

An $N^+$-type source diffusion layer 56 having the same potential as that of the P-type well region 42 is formed in that portion of the surface of the P-type well region 42 which corresponds to a common source region between the gate polysilicon electrodes 47a and 47b.

A $P^+$-type substrate diffusion layer 57 is formed selectively in part of the P-type well region 42 as one different from the source diffusion layer 56.

Drain contacts 58 and 58 are connected to their respective drain diffusion layers 55 and 55 through the gate insulation film 46. A source contact 59 is connected to the source diffusion layer 56 through the gate insulation film 46, and a substrate contact 61 is connected to the substrate diffusion layer 57 through an insulation film 60.

BRIEF SUMMARY OF THE INVENTION

The object of the present invention is to provide a MOS semiconductor device capable of reducing in layout area and decreasing in chip size.

To attain the above object, according to a first aspect of the present invention, there is provided a MOS semiconductor device comprising a first semiconductor layer of a first conductivity type, a second semiconductor layer of a second conductivity type surrounded by the first semiconductor layer, a gate electrode having an insulation film and provided on a surface of the second semiconductor layer, a first diffusion layer of the first conductivity type, whose potential differs from that of the second semiconductor layer and which is formed in a surface area of the second semiconductor layer, the first diffusion layer being located at a given distance from a first interface between the first semiconductor layer and the second semiconductor layer, a second diffusion layer of the first conductivity type, whose potential is equal to that of the second semiconductor layer and which is formed in the surface area of the second semiconductor layer, the second diffusion layer being located at a given distance from a second interface between the first semiconductor layer and the second semiconductor layer, a semiconductor region of the second conductivity type formed adjacent to the second diffusion layer at least in the surface area of the second semiconductor layer, a low-resistance layer formed on the semiconductor region and the second diffusion layer integrally with one another as a single layer, and a connection electrode connected to the semiconductor region and the second diffusion layer through the low-resistance layer.

In the MOS semiconductor device so constituted, the second diffusion layer and connection electrode can be brought into contact with each other by means of the low-resistance layer. Thus, a source contact need not be formed only on a source diffusion layer and accordingly the source diffusion layer can be decreased in area.

According to a second aspect of the present invention, there is provided a MOS semiconductor device comprising a source diffusion layer and a semiconductor substrate whose potential is equal to that of the source diffusion layer, wherein the source diffusion layer serves as a substrate diffusion layer, and a source contact connected to the source diffusion layer serves as a substrate contact connected to the substrate diffusion layer.

In the MOS semiconductor device so constituted, one contact can be formed to serve as both the source contact connected to the source diffusion layer and the substrate contact connected to the substrate diffusion layer. The source contact can thus be arranged closer to an interface between N- and P-type well regions.

According to a third aspect of the present invention, there is provided a MOS semiconductor device comprising a first semiconductor layer of a first conductivity type, a second semiconductor layer of a second conductivity type surrounded by the first semiconductor layer, a gate electrode having an insulation film and provided on a surface of the second semiconductor layer, a first diffusion layer of the first conductivity type, whose potential differs from that of the second semiconductor layer and which is formed in a surface area of the second semiconductor layer, the first diffusion layer being located at a given distance from a first interface between the first semiconductor layer and the second semiconductor layer, a second diffusion layer of the second conductivity type, whose potential is equal to that of the second semiconductor layer and which is formed in the surface area of the second semiconductor layer, the second diffusion layer being located within a given distance from the first interface between the first semiconductor layer and the second semiconductor layer, and a substrate diffusion layer of the second conductivity type provided in the second semiconductor layer.

In the MOS semiconductor device so constituted, a source diffusion layer can be formed to have the same conductivity type as that of the substrate diffusion layer. Therefore, the source diffusion layer can be located within a given distance from an interface between N- and P-type well regions.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE INVENTION

Embodiments of the present invention will now be described with reference to the accompanying drawings.

(First Embodiment)

Figure 4A:
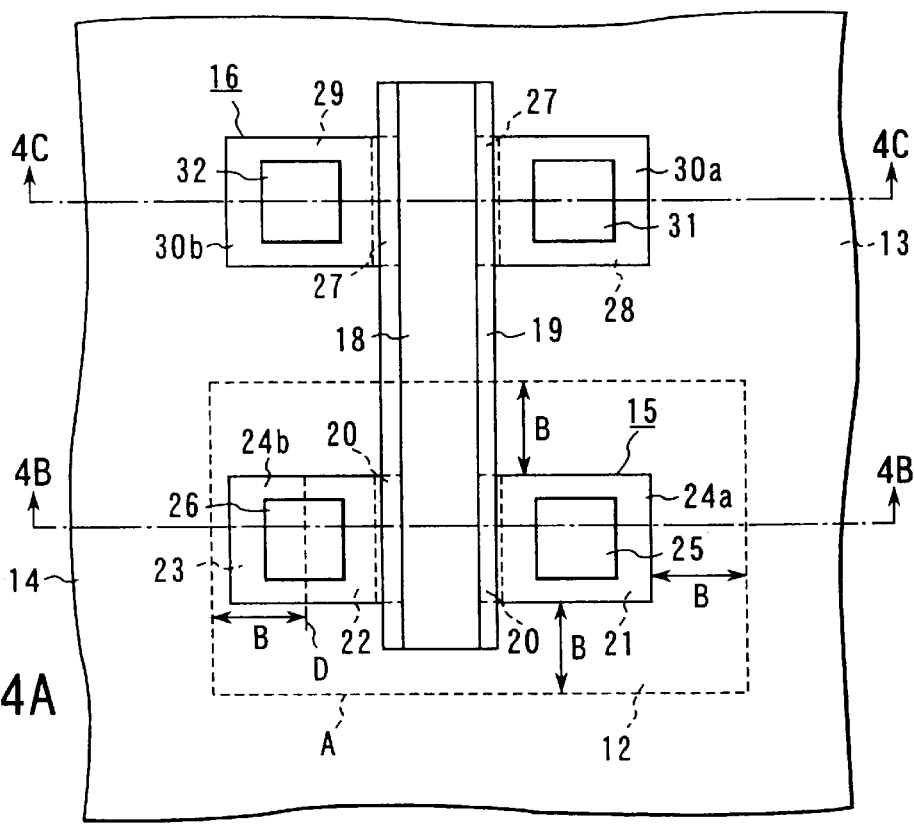
FIG. 4A is a plan view schematically showing the arrangement of a CMOS circuit according to a first embodiment of the present invention.
Figure 4B:
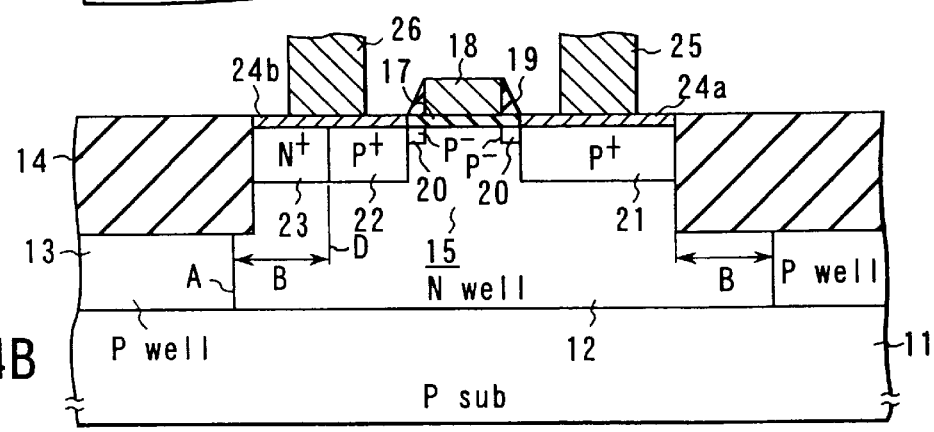
FIG. 4B is a schematic cross-sectional view of the CMOS circuit taken along line 4B—4B of FIG. 4A.
Figure 4C:
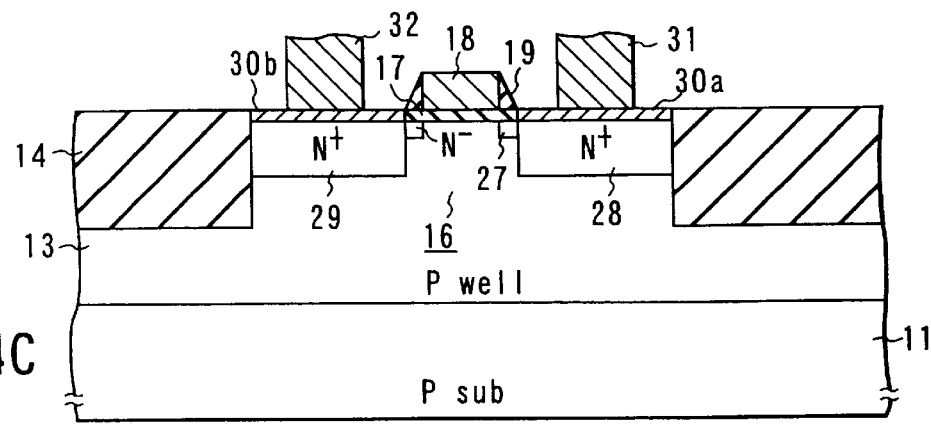
FIG. 4C is a schematic cross-sectional view of the CMOS circuit taken along line 4C—4C of FIG. 4A.

FIGS. 4A to 4C schematically show the arrangement of a MOS integrated circuit according to a first embodiment of the present invention, taking a CMOS circuit as an example. Of these figures, FIG. 4A is a plan view of the CMOS circuit, FIG. 4B is a cross-sectional view of the CMOS circuit taken along line 4B—4B of FIG. 4A, and FIG. 4C is a cross-sectional view of the CMOS circuit taken along line 4C—4C of FIG. 4A.

As shown, an N-type well region (a second semiconductor layer of a second conductivity type) 12 is formed selectively in a surface area of a P-type Si (silicon) substrate 11. A P-type well region (a first semiconductor layer of a first conductivity type) 13 is formed so as to surround the N-type well region 12.

An element isolation region 14 having an STI structure is formed selectively in the surface area of the Si substrate 11, as are an active region 15 of a P-channel MOS transistor and an active region 16 of an N-channel MOS transistor.

The top surfaces of the active regions 15 and 16 are partly covered with their respective gate insulation films 17. A gate polysilicon electrode 18 is provided so as to connect the active regions 15 and 16 with each other through the gate insulation films 17. The electrode 18 has side walls 19 and 19 on both sides thereof.

In the active region 15 of the P-channel MOS transistor, P$^-$-type regions 20 and 20 each having an LDD structure are formed in a surface area of the N-type well region 12 by ion-implantation and diffusion of P-type impurities using the gate polysilicon electrode 18 as a mask.

A P$^+$-type drain diffusion layer (a first diffusion layer of a first conductivity type) 21 whose potential differs from that of the N-type well region 12, is formed selectively in a portion corresponding to a drain region in the surface area of the N-type well region 12 where the p$^-$-type regions 20 and 20 are formed. The layer 21 is located at a fixed distance B from an interface (first interface) A between the N- and P-type well regions 12 and 13.

A P$^+$-type source diffusion layer (a second diffusion layer of the first conductivity type) 22 having the same potential as that of the N-type well region 12, and an N$^+$-type substrate diffusion layer (a third diffusion layer) 23 which serves as a semiconductor region of a second conductivity type and differs from the source diffusion layer 22, are formed in a portion corresponding to a source region in the surface area of the N-type well region 12 where the P$^-$-type regions 20 and 20 are formed.

The source diffusion layer 22 is formed at a fixed distance B from another interface A (second interface) between the N- and P-type well regions 12 and 13. The substrate diffusion layer 23 is located within the fixed distance B and formed adjacent to the source diffusion layer 22 with another interface (third interface) D therebetween.

The drain diffusion layer 21 and source diffusion layer 22 are formed by ion implantation and diffusion of P-type impurities using a resist film (not shown), which covers an area where the gate polysilicon electrode 18, side walls 19 and 19 and substrate diffusion layer 23 are to be formed, as a mask.

The substrate diffusion layer 23 is formed by ion implantation and diffusion of N-type impurities using a resist film (not shown) as a mask, which covers an area where the gate polysilicon electrode 18, side walls 19 and 19, drain diffusion layer 21 and source diffusion layer 22 are to be formed.

Salicide (self-aligned-silicide) layers (low-resistance layers) 24a and 24b, which are constituted of a Ti silicide film or a Co silicide film, are provided on the surface of the drain diffusion layer 21 and the surfaces of the source and substrate diffusion layers 22 and 23, respectively.

A drain contact 25 for connecting the drain diffusion layer 21 and its upper wiring layer (not shown) is formed on the salicide layer 24a, while a source contact (connection electrode) 26 for connecting the source and substrate diffusion layers 22 and 23 to their upper wiring layer (not shown) is formed on the salicide layer 24b.

Since the source contact 26 and source diffusion layer 22 are connected through the salicide layer 24b, the salicide layer 24b has only to include the source contact 26 and the source diffusion layer 22 need not include it. The source diffusion layer 22 can thus be decreased in area at the fixed distance B from the interface A between the N- and P-type well regions 12 and 13.

Since both the source diffusion layer 22 and substrate diffusion layer 23 contact the source contact 26, the source contact 26 can be formed even in a dead space where a source diffusion layer is inhibited from being arranged under conventional design rules.

Figure 5:
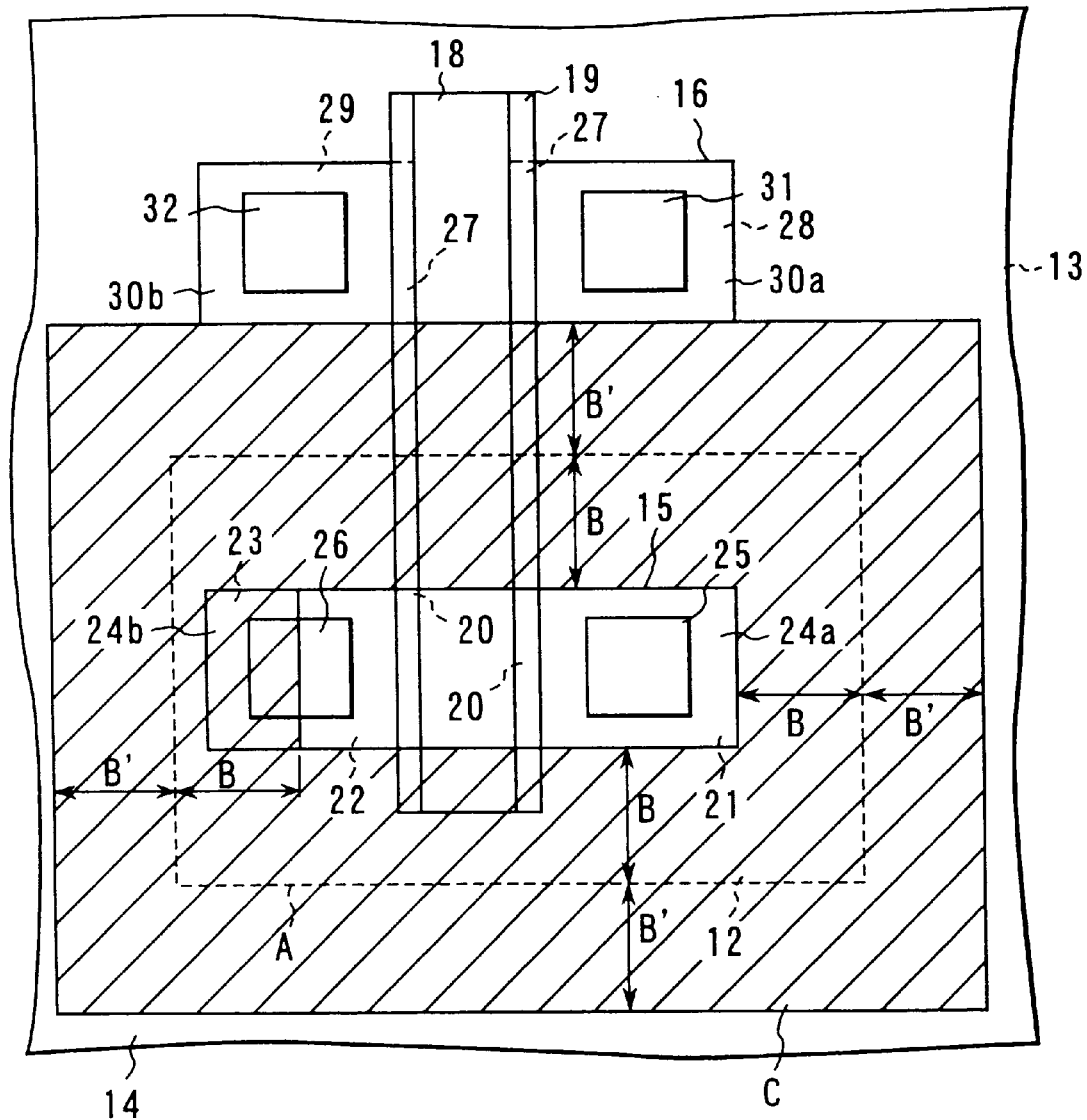
FIG. 5 is a schematic plan view illustrating a dead space of a diffusion layer in the CMOS circuit shown in FIGS. 4A to 4C.

Consequently, as shown in FIG. 5, the source contact 26 can be arranged closer to the P-type well region 13, and a dead space (a hatched area delimited by the distances B and B') is decreased by a reduced area of the source diffusion layer 22, with the result that the entire layout area is reduced.

In the active region 16 of the N-channel MOS transistor, as shown in FIGS. 4A and 4C, N$^-$-type regions 27 and 27 of the LDD structure are formed in a surface area of the P-type well region 13 by ion-implantation and diffusion of N-type impurities using the gate polysilicon electrode 18 as a mask, and N$^+$-type drain and source diffusion layers 28 and 29 are formed by ion-implantation and diffusion of N-type impurities using the gate polysilicon electrode 18 and side walls 19 and 19 as masks.

Salicide layers 30a and 30b, such as Ti silicide films and Co silicide films, are provided on the surface of the drain diffusion layer 28 and that of the source diffusion layer 29, respectively.

A drain contact 31 for connecting the drain diffusion layer 28 and its upper wiring layer (not shown) is formed on the salicide layer 30a, while a source contact 32 for connecting the source diffusion layer 29 and its upper wiring layer (not shown) is formed on the salicide layer 30b.

According to the CMOS circuit having the above arrangement, in the P-channel MOS transistor wherein the $P^+$-type source diffusion layer 22 and N-type well region 12 are at the same potential, the drain contact 25 whose potential differs from that of the P-type well region 13 is formed on the drain diffusion layer 21, while the source contact 26 can be formed everywhere on the salicide layer 24b.

Since, therefore, part of the source contact 26 is provided on the substrate diffusion layer 23 which can be formed near the interface A between the N- and P-type well regions 12 and 13, the conventional design rules having an inclusion relation between the source contact and source diffusion layer can be obviated.

As described above, the source diffusion layer and source contact can be brought into contact with each other through the salicide layer.

More specifically, the source contact is formed not only on the $P^+$-type source diffusion layer but also on the $N^+$-type substrate diffusion layer. The source diffusion layer can thus be decreased in area and the source contact having the same potential as that of the P-type well region can be arranged closer to the P-type well region. Consequently, the conventional design rules having an inclusion relation between the source contact and source diffusion layer can be obviated, with the result that the layout area can be reduced and the chip size can be decreased.

In the foregoing first embodiment, the $N^+$-type substrate diffusion layer 23 is provided in the lateral (width) direction of the $P^+$-type source diffusion layer 22. The present invention is not limited to this. For example, as illustrated in FIGS. 6A and 6B, the $N^+$-type substrate diffusion layer 23 can be formed in the longitudinal direction of the $P^+$-type source diffusion layer 22.

(Second Embodiment)

Figure 6A:
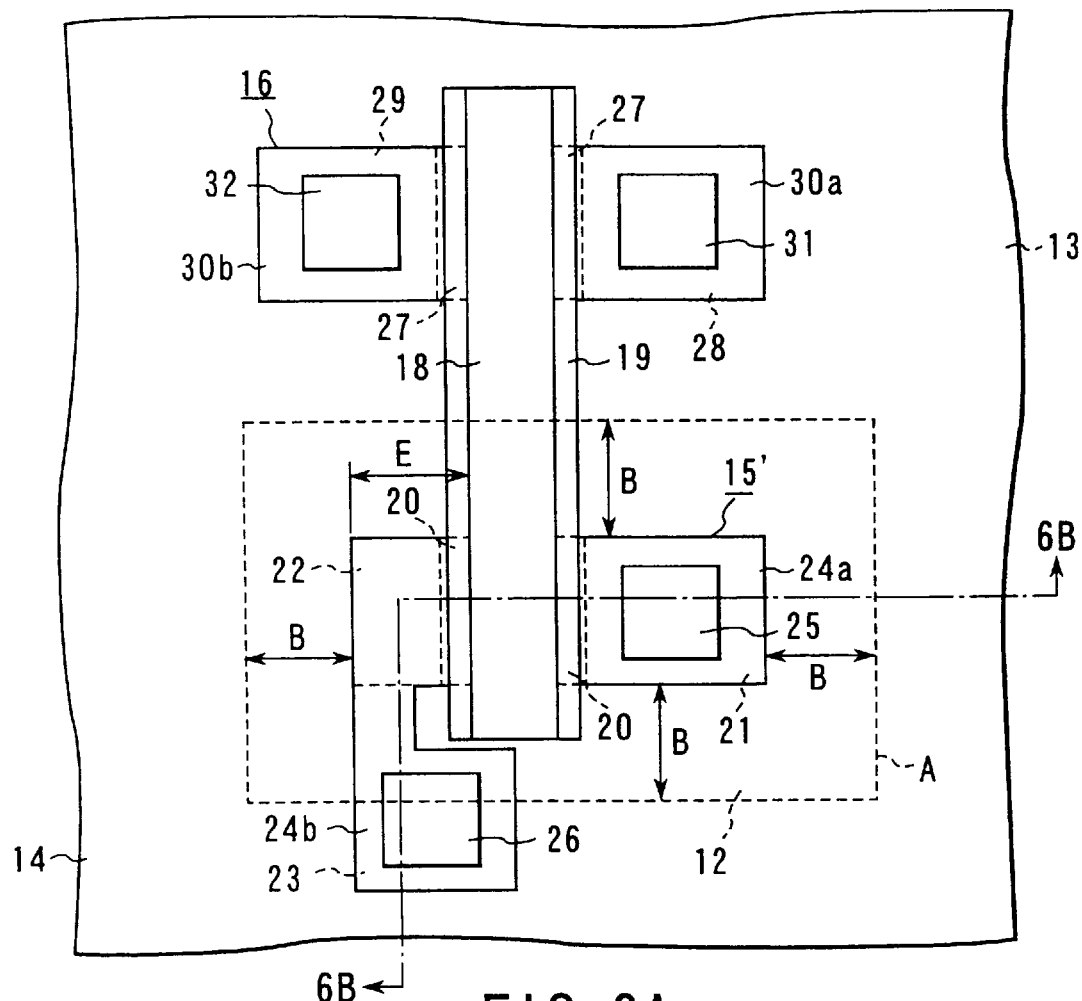
FIG. 6A is a plan view schematically showing the arrangement of a CMOS circuit according to a second embodiment of the present invention.
Figure 6B:
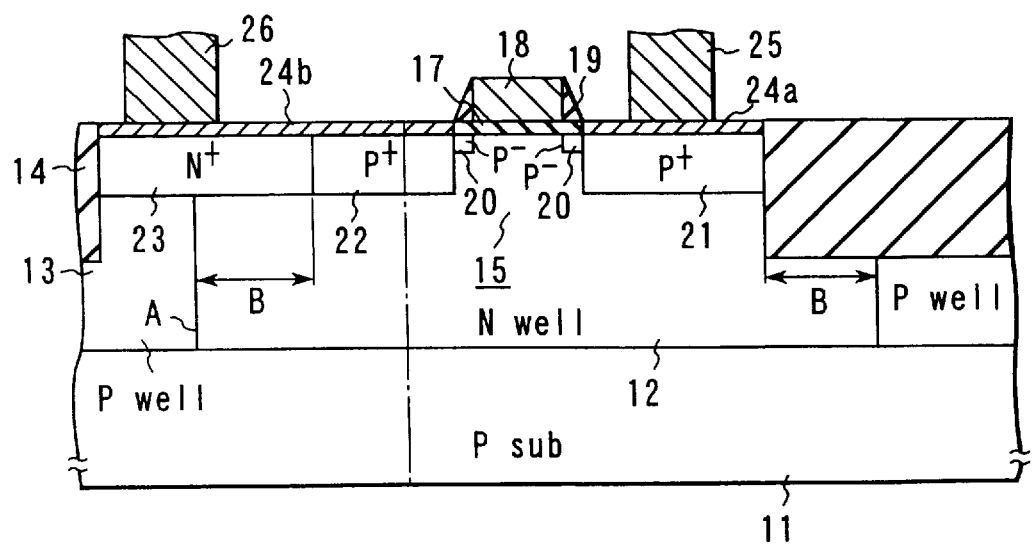
FIG. 6B is a schematic cross-sectional view of the CMOS circuit taken along line 6B—6B of FIG. 6A.

FIGS. 6A and 6B schematically show the arrangement of a MOS integrated circuit according to a second embodiment of the present invention taking as an example a CMOS circuit in which an $N^+$-type substrate is formed in the longitudinal direction of a $P^+$-type source diffusion layer. Of these figures, FIG. 6A is a schematic plan view of the CMOS circuit and FIG. 6B is a schematic cross-sectional view thereof taken along line 6B—6B of FIG. 6A.

In the second embodiment, an active region 15' of a P-channel MOS transistor is shaped like a letter "L". A $P^+$-type source diffusion layer 22 is formed in the active region 15'. There is a fixed distance B between the region 15' and an interface A between N- and P-type well regions 12 and 13, and the layer 22 has a length E required as an SDG (source/drain/gate) at the minimum. On the other hand, an $N^+$-type substrate diffusion layer 23 is formed in the longitudinal direction of the source diffusion layer 22 and provided over both the N- and P-type well regions 12 and 13.

A salicide layer 24b is formed on the surfaces of the source and substrate diffusion layers 22 and 23, and a source contact (connection electrode) 26 is connected to the salicide layer 24b.

Even with the above arrangement, in the P-channel MOS transistor wherein the $P^+$-type source diffusion layer 22 and N-type well region 12 are at the same potential, the source contact 26 need not be formed only on the source diffusion layer 22; accordingly, the layer 22 can be decreased in area and the source contact 26 can be arranged close to the P-type well region 13, with the result that the layout area can be reduced and the chip size can be decreased.

In both the first and second embodiments, the present invention is applied to the CMOS circuit using a P-type silicon substrate. However it is not limited to this but can be applied to a CMOS circuit (N-channel MOS transistor) using an N-type silicon substrate.

More specifically, the N-channel MOS transistor wherein an $N^+$-type source diffusion layer and its underlying P-type well region are at the same potential, has only to be constituted that a $P^+$-type substrate diffusion layer is formed adjacent to the $N^+$-type source diffusion layer and a source contact is formed on the $N^+$-type source diffusion layer and $P^+$-type substrate diffusion layer through a salicide layer.

Similarly, the present invention is applicable to various types of MOS integrated circuits using an N- or P-type well region as a substrate.

(Third Embodiment)

Figure 7A:
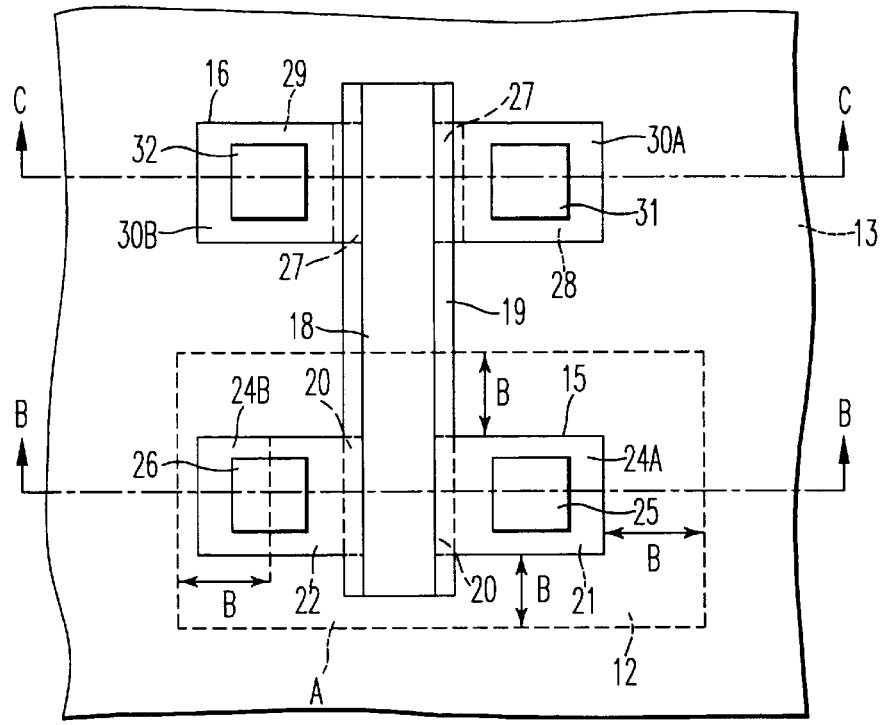
FIG. 7A is a plan view schematically showing the arrangement of a CMOS circuit according to a third embodiment of the present invention.
Figure 7B:
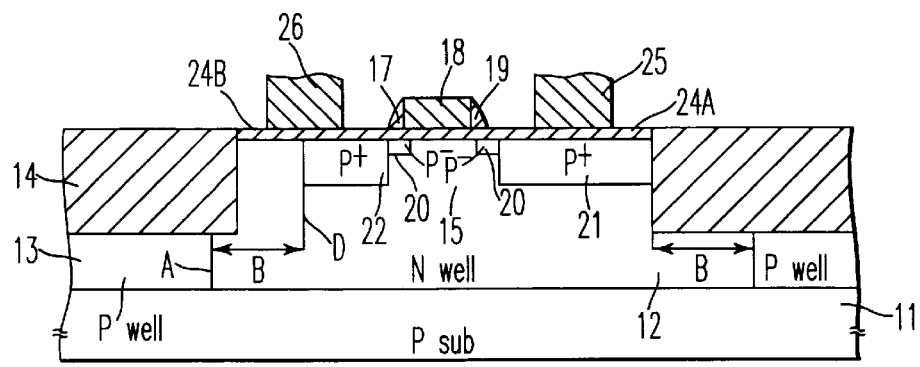
FIG. 7B is a schematic cross-sectional view of the CMOS circuit taken along line B—B of FIG. 7A.
Figure 7C:
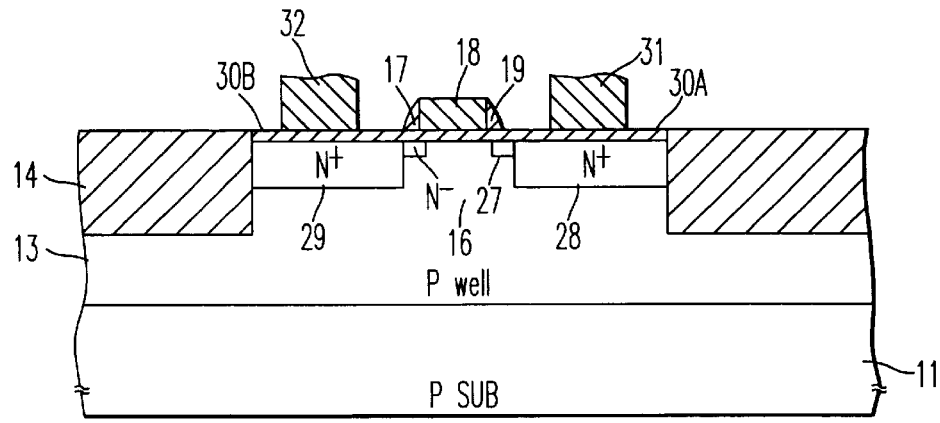
FIG. 7C is a schematic cross-sectional view of the CMOS circuit taken along line C—C of FIG. 7A.

FIGS. 7A to 7C schematically show the arrangement of a MOS integrated circuit according to a third embodiment of the present invention, taking a CMOS circuit as an example. Of these Figures, FIG. 7A is a plan view of the CMOS circuit, FIG. 7B is a cross-sectional view of the CMOS circuit taken along line B—B in FIG. 7A, and FIG. 7C is a cross-sectional view of the CMOS circuit taken along line C—C in FIG. 7A.

In the third embodiment, in the P-channel MOS transistor, the N-type well region 12 serves as a substrate diffusion layer adjacent to the P+source diffusion layer 22.

Thus, not only the substrate diffusion layer is formed adjacent to the source diffusion layer, but also an underlying well region (second semiconductor layer) can be utilized as a substrate diffusion layer as it is.

Figure 8:
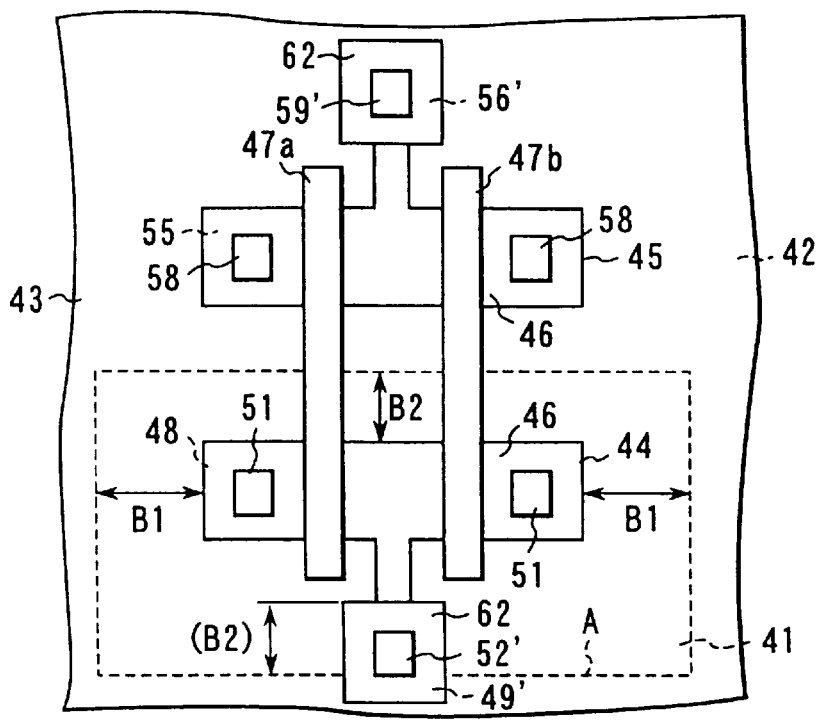
FIG. 8 is a plan view schematically showing the layout of a memory cell according to a fourth embodiment of the present invention.

In a MOS integrated circuit wherein a substrate contact is formed separately from a source contact, as shown in FIG. 8, it is easy to form one contact common to both the source and substrate contacts.

(Fourth Embodiment)

Referring to FIG. 8, the arrangement of a MOS integrated circuit according to a fourth embodiment of the present invention will now be described briefly, taking a flip-flop memory cell or a basic memory cell as an example. Since the fundamental arrangement of the memory cell is the same as that of the prior art memory cell (shown in FIG. 3), only different portions will be described.

In a P-channel MOS transistor of the memory cell of the fourth embodiment, N-type impurities are implanted to form an N-type substrate/source diffusion layer 49' which serves as both a substrate diffusion layer and a source diffusion layer. Thus, a contact (source contact) 52', which is connected to the N-type substrate/source diffusion layer 49' through a salicide layer 62, can be formed by a single contact serving as both the source contact (52 in FIG. 3) connected to the source diffusion layer (49 in FIG. 3) and the substrate contact (54 in FIG. 3) connected to the substrate diffusion layer (50 in FIG. 3).

Similarly, in an N-channel MOS transistor of the memory cell, P-type impurities are implanted to form a P-type substrate/source diffusion layer 56' which serves as both a substrate diffusion layer and a source diffusion layer. Thus, a contact (source contact) 59', which is connected to the P-type substrate/source diffusion layer 56' through a salicide layer 62, can be formed by a single contact common to the source contact (59 in FIG. 3) connected to the source diffusion layer (56 in FIG. 3) and the substrate contact (61 in FIG. 3) connected to the substrate diffusion layer (57 in FIG. 3).

With the above arrangement, both the contacts 52' and 59' can be formed closer to an interface A between N- and P-type well regions 41 and 42. Therefore, the layout area (cell size) can be reduced by the area for forming the substrate diffusion layer, which is delimited by a distance $B_2$ substantially equal to the distance from the source diffusion layer to the N-type well region. The reason is as follows. In the P-channel MOS transistor wherein the substrate and N-type well regions have the same potential, the N-type well region and source diffusion layer are set at the same potential by means of the substrate. Consequently, the extension of a depletion layer from the source diffusion layer can be lessened and accordingly the distance $B_2$ can be made shorter than the distance $B_1$.

The present invention is not limited to the above memory cell in which a single contact can be used to function as both the source and substrate contacts. For example, as illustrated in FIG. 9, the layout area (cell size) can be decreased even though the source and substrate contacts are formed separately from each other.

(Fifth Embodiment)

Figure 9:
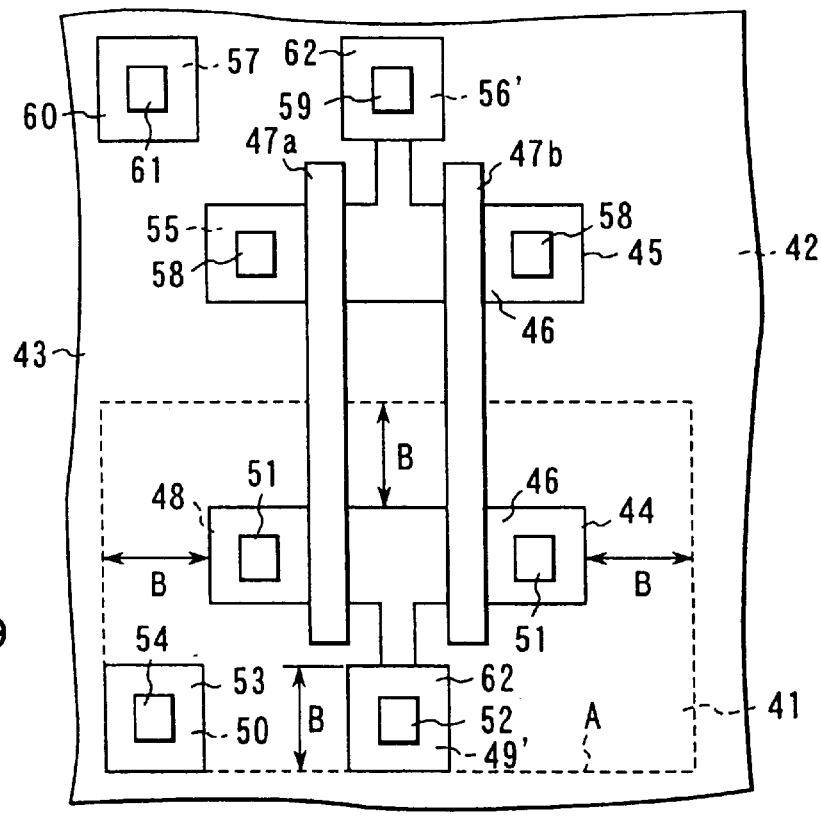
FIG. 9 is a plan view schematically showing the layout of a memory cell according to a fifth embodiment of the present invention.

FIG. 9 illustrates the arrangement of a MOS integrated circuit according to a fifth embodiment of the present invention, taking a flip-flop memory cell or a basic memory cell as an example. Since the fundamental arrangement of the memory cell is the same as that of the prior art memory cell (shown in FIG. 3), only different portions will be described hereinafter.

In a P-channel MOS transistor of the memory cell, $P^+$-type drain diffusion layers 48 and 48 whose potential differs from that of an N-type well region 41, are arranged at a fixed distance B from an interface A between the N- and P-type well regions 41 and 42, and an N-type substrate/source diffusion layer 49' is formed, within the fixed distance B, separately from a substrate diffusion layer 50.

Similarly, in an N-channel MOS transistor of the memory cell, a P-type substrate/source diffusion layer 46' is provided in a source-diffusion-layer forming position separately from a substrate diffusion layer 57.

Figure 1A:
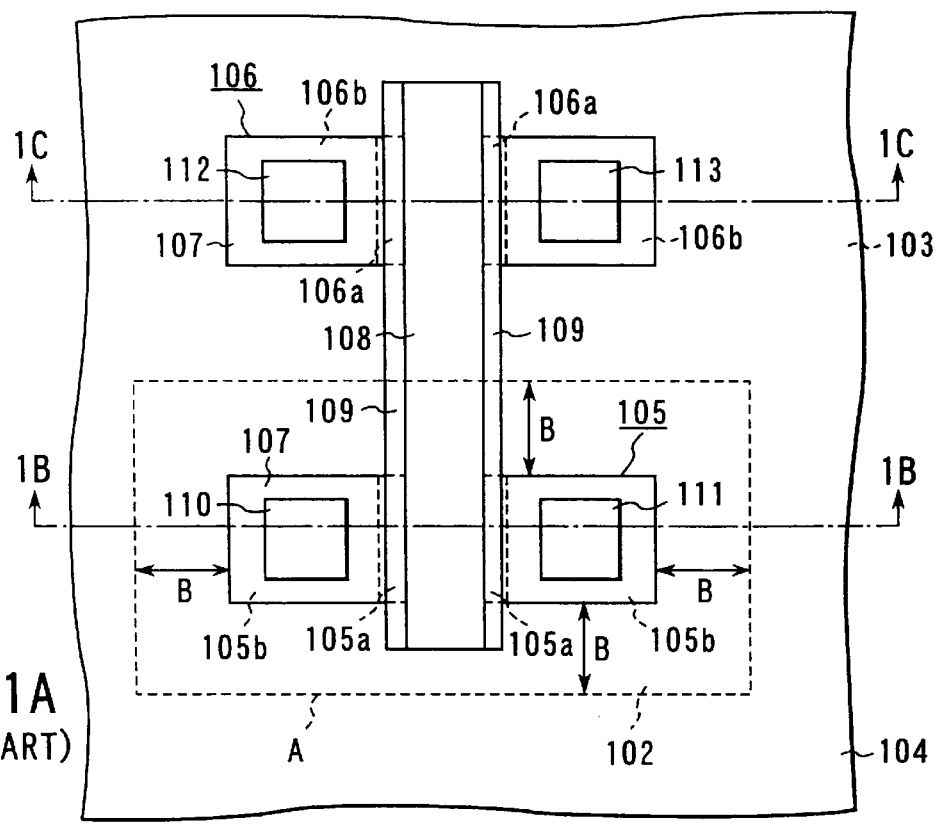
FIG. 1A is a plan view schematically showing the arrangement of a prior art CMOS circuit designed under conventional design rules.
Figure 1B:
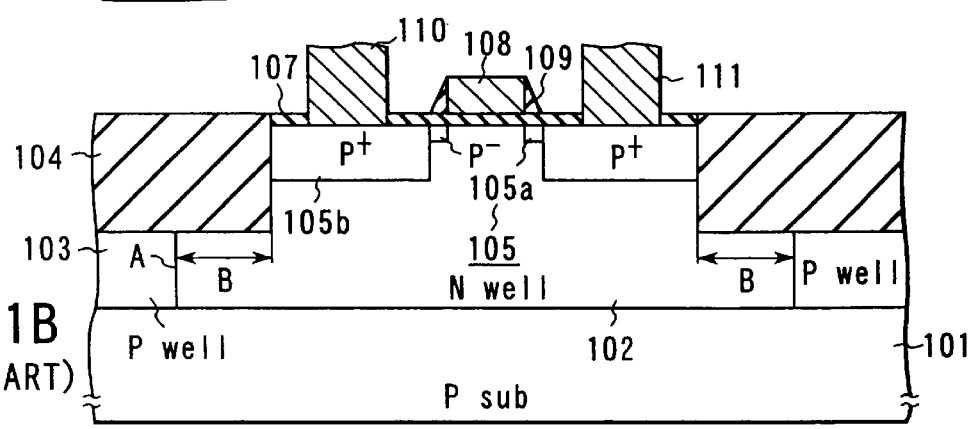
FIG. 1B is a schematic cross-sectional view of the prior art CMOS circuit taken along line 1B—1B of FIG. 1A.
Figure 1C:
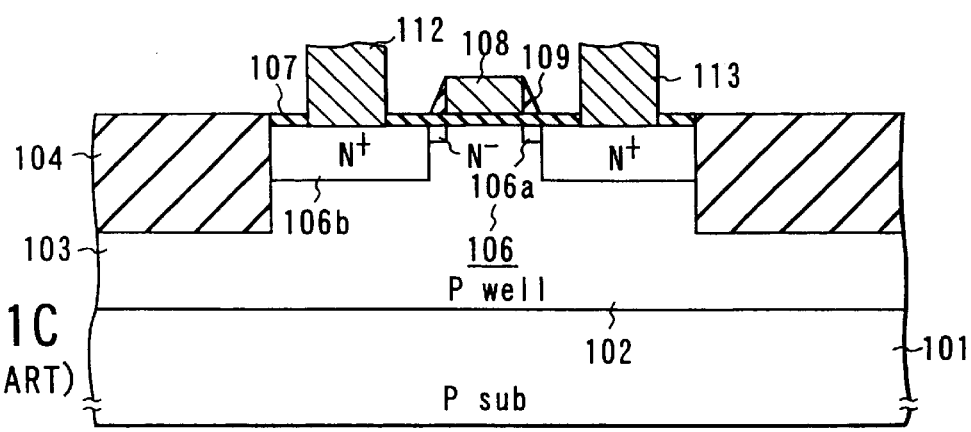
FIG. 1C is a schematic cross-sectional view of the prior art CMOS circuit taken along line 1C—1C of FIG. 1A.
Figure 2:
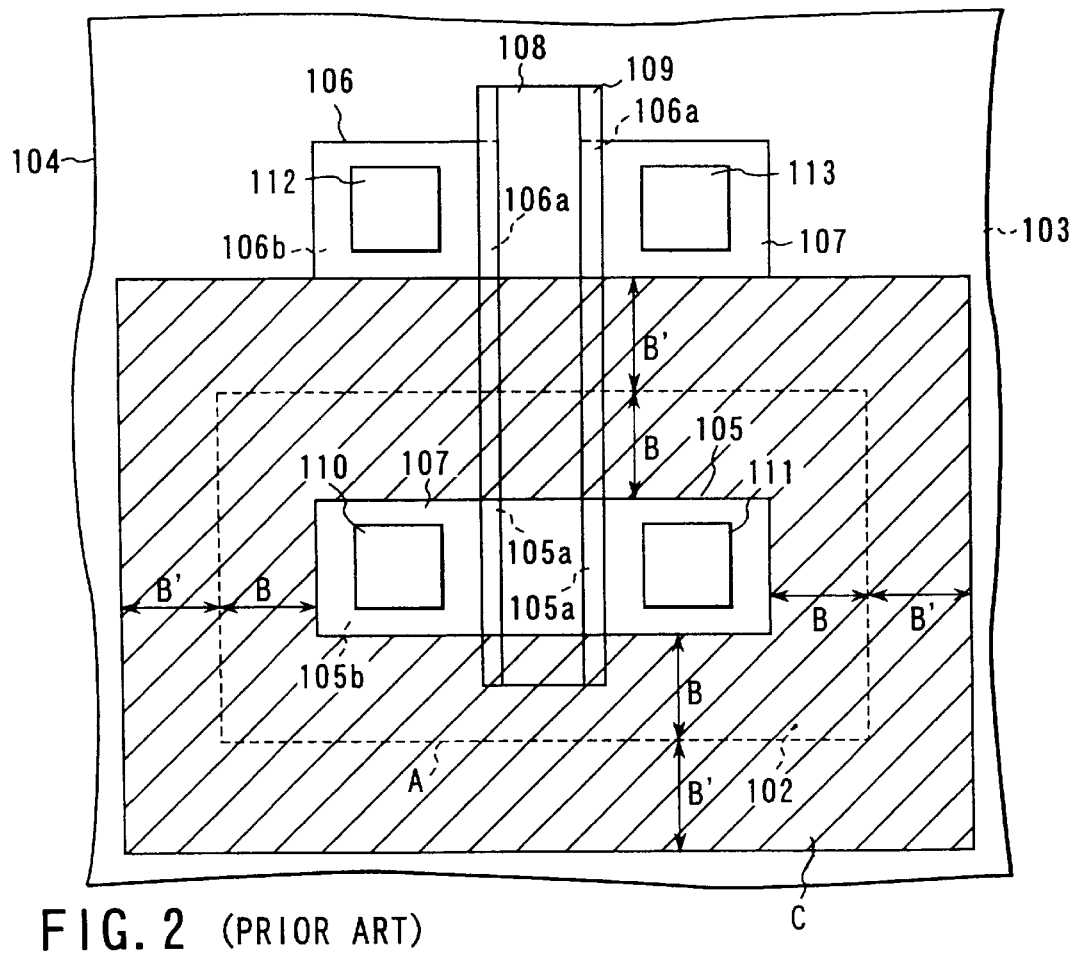
FIG. 2 is a schematic plan view illustrating a dead space of a diffusion layer in the prior art CMOS circuit.
Figure 3:
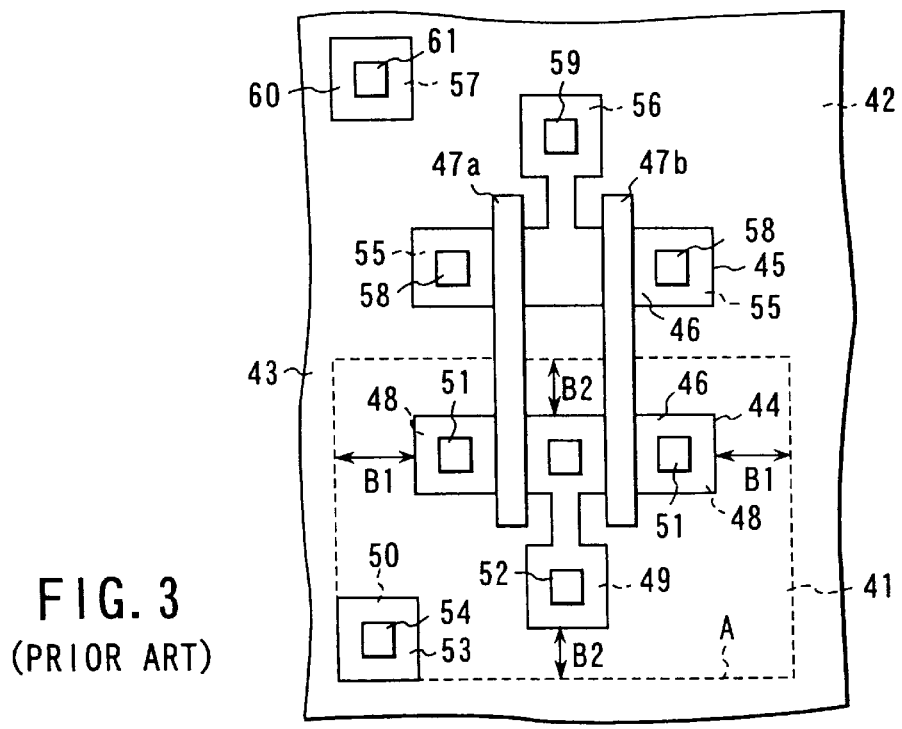
FIG. 3 is a schematic plan view of a prior art memory cell designed under conventional design rules.

In the above arrangement, too, the layout area (cell size) can be reduced by the distance $B_2$ shown in FIG. 3.

It is needless to say that various changes and modifications can be made without departing from the scope of the subject matter of the present invention.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A MOS semiconductor device comprising:

a first semiconductor layer of a first conductivity type;

a second semiconductor layer of a second conductivity type surrounded by the first semiconductor layer;

a gate electrode having an insulation film and provided on a surface of the second semiconductor layer;

a first diffusion layer of the first conductivity type, whose potential differs from that of the second semiconductor layer and which is formed in a surface area of the second semiconductor layer, the first diffusion layer being located at a given distance from a first interface between the first semiconductor layer and the second semiconductor layer;

a second diffusion layer of the first conductivity type, whose potential is equal to that of the second semiconductor layer and which is formed in the surface area of the second semiconductor layer, the second diffusion layer being located at a given distance from a second interface between the first semiconductor layer and the second semiconductor layer;

a semiconductor region of the second conductivity type formed adjacent to the second diffusion layer at least in the surface area of the second semiconductor layer;

a low-resistance layer formed on the semiconductor region and the second diffusion layer integrally with one another as a single layer; and a connection electrode connected to the semiconductor region and the second diffusion layer through the low-resistance layer.

2. A MOS semiconductor device according to claim 1, wherein the semiconductor region is formed in a width direction of the second diffusion layer.

3. A MOS semiconductor device according to claim 1, wherein a distance between the second interface and a third interface between the second diffusion layer and the semiconductor region is substantially equal to the distance between the first diffusion layer and the first interface, and a distance between the second interface and the gate electrode is shorter than a distance between the first interface and the gate electrode.

4. A MOS semiconductor device according to claim 1, wherein the semiconductor region is formed in a longitudinal direction of the second diffusion layer.

5. A MOS semiconductor device according to claim 4, wherein a distance between an end portion of the second diffusion layer and the second interface is substantially equal to the distance between the first diffusion layer and the first interface, and a distance between the second interface and the gate electrode is shorter than a distance between the first interface and the gate electrode.

6. A MOS semiconductor device according to claim 1, wherein the semiconductor region is formed by a third diffusion layer.

7. A MOS semiconductor device according to claim 1, wherein the semiconductor region is formed by the second semiconductor layer.

8. A MOS semiconductor device according to claim 1, wherein the low-resistance layer is formed by a silicide layer.

9. A MOS semiconductor device comprising:

a first semiconductor layer of a first conductivity type;

a second semiconductor layer of a second conductivity type surrounded by the first semiconductor layer;

a gate electrode having an insulation film and provided on a surface of the second semiconductor layer;

a first diffusion layer of the first conductivity type, whose potential differs from that of the second semiconductor layer and which is formed in a surface area of the second semiconductor layer, the first diffusion layer being located at a given distance from a first interface between the first semiconductor layer and the second semiconductor layer;

a second diffusion layer of the second conductivity type, whose potential is equal to that of the second semiconductor layer and which is formed in the surface area of the second semiconductor layer, the second diffusion layer being located within a given distance from the first interface between the first semiconductor layer and the second semiconductor layer; and a substrate diffusion layer of the second conductivity type provided in the second semiconductor layer.

* * * * *